(12) United States Patent
Onitsuka

(10) Patent No.: US 10,991,671 B2
(45) Date of Patent: Apr. 27, 2021

(54) MULTI-PIECE WIRING SUBSTRATE, ELECTRONIC COMPONENT HOUSING PACKAGE, AND ELECTRONIC DEVICE

(71) Applicant: KYOCERA Corporation, Kyoto (JP)

(72) Inventor: Yoshitomo Onitsuka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 1 day.

(21) Appl. No.: 16/614,519

(22) PCT Filed: May 22, 2018

(86) PCT No.: PCT/JP2018/019680
§ 371 (c)(1),
(2) Date: Nov. 18, 2019

(87) PCT Pub. No.: WO2018/216693
PCT Pub. Date: Nov. 29, 2018

(65) Prior Publication Data
US 2020/0168577 A1    May 28, 2020

(30) Foreign Application Priority Data

May 23, 2017  (JP) .............................. JP2017-101869

(51) Int. Cl.
| H01L 23/52 | (2006.01) |
| H01L 23/00 | (2006.01) |
| H01L 23/043 | (2006.01) |
| H01L 23/48 | (2006.01) |

(52) U.S. Cl.
CPC ............ *H01L 24/45* (2013.01); *H01L 23/043* (2013.01); *H01L 23/481* (2013.01)

(58) Field of Classification Search
CPC ...... H01L 23/043; H01L 23/481; H01L 24/45
USPC .......................................................... 257/784
See application file for complete search history.

(56) References Cited

U.S. PATENT DOCUMENTS

| 7,102,085 B2* | 9/2006 | Ohta ................. H01L 23/49833 174/260 |
| 7,526,152 B2* | 4/2009 | Asai ..................... G02B 6/4204 385/14 |
| 7,948,092 B2* | 5/2011 | Murayama ........ H01L 21/76898 257/783 |

(Continued)

FOREIGN PATENT DOCUMENTS

JP        2014-027219 A     2/2014

*Primary Examiner* — Luan C Thai
(74) *Attorney, Agent, or Firm* — Volpe Koenig

(57) ABSTRACT

A multi-piece wiring substrate includes a matrix substrate including a first main surface, a second main surface opposite to the first main surface, a third main surface disposed between the first main surface and the second main surface, an arrangement of a plurality of wiring substrate regions, a margin region surrounding the plurality of wiring substrate regions, and a dividing groove. The multi-piece wiring substrate further includes a through-hole disposed across the boundary between the wiring substrate regions or the boundary between the wiring substrate regions and the margin region, and which penetrates from the first main surface to the second main surface, and an external connection conductor at each corner of the wiring substrate regions on the second main surface. An auxiliary conductor is disposed around the through-hole on the third main surface.

14 Claims, 6 Drawing Sheets

(56) References Cited

U.S. PATENT DOCUMENTS 9,379,081 B2 * 6/2016 Yang ...................... H01L 24/09

* cited by examiner

MULTI-PIECE WIRING SUBSTRATE, ELECTRONIC COMPONENT HOUSING PACKAGE, AND ELECTRONIC DEVICE

TECHNICAL FIELD

The present invention relates to a multi-piece wiring substrate in which a plurality of wiring substrate regions including electronic component mount portions are arranged vertically and horizontally on a matrix substrate, an electronic component housing package, and an electronic device.

BACKGROUND ART

Conventionally, the electronic component housing package used for accommodating the electronic component such as a semiconductor element and a surface acoustic wave element includes a concave mount portion for accommodating the electronic component on an insulating substrate made of a ceramic sintered body such as an aluminum oxide sintered body or a glass ceramic sintered body. In general, the insulating substrate that becomes the electronic component housing package includes a quadrangular plate-shaped base portion and a quadrangular frame-shaped frame portion which is laminated on the upper surface of the base portion and which surrounds the mount portion. The concave mount portion is formed by the upper surface of the base portion and an inner side surface of the frame portion. After the electronic component is mounted on the mount portion, a lid made of metal is bonded to a frame-shaped metallized layer on an upper surface of a frame body and the mount portion is hermetically sealed. A structure is also adopted in which a metal frame body (also referred to as a seal ring) is bonded to the upper surface of the frame portion with the frame-shaped metallized layer and a brazing material interposed therebetween, and the concave mount portion is formed by the upper surface of the base portion, the inner side surface of the frame portion, and the inner side surface of the metal frame body.

Such an electronic component housing package is generally manufactured in a form of a so-called multi-piece wiring substrate in which a plurality of wiring substrates is obtained simultaneously and integratedly from a matrix substrate having a wide area. In the multi-piece wiring substrate, for example, a plurality of wiring substrate regions, each of which becomes an individual electronic component housing package, is arranged vertically and horizontally on the matrix substrate made of an aluminum oxide sintered body. A dividing groove is formed on a main surface such as the upper surface of the matrix substrate along a boundary between the wiring substrate regions. Bending stress is applied to the matrix substrate with the dividing groove therebetween and the matrix substrate is broken, thereby being separated into individual wiring substrates. A method of providing the dividing groove by a laser has been proposed (see, for example, Japanese Unexamined Patent Application Publication No. 2014-27219).

SUMMARY OF INVENTION

A multi-piece wiring substrate according to the present disclosure includes a matrix substrate including a first main surface, a second main surface opposite to the first main surface, a third main surface disposed between the first main surface and the second main surface, the third main surface comprising a mount portion for mounting an electronic component, and a connection conductor for connecting to the electronic component, an arrangement of a plurality of wiring substrate regions, a margin region surrounding the plurality of wiring substrate regions, and a dividing groove on the first main surface and the second main surface along a boundary between the wiring substrate regions and a boundary between the wiring substrate regions and the margin region. The multi-piece wiring substrate further includes a through-hole disposed across the boundary between the wiring substrate regions or the boundary between the wiring substrate regions and the margin region, and which penetrates from the first main surface to the second main surface, and an external connection conductor at each corner of the wiring substrate regions on the second main surface. An auxiliary conductor is disposed around the through-hole on the third main surface, the auxiliary conductor includes a wide conductor on a side connected to the connection conductor and a narrow conductor on a side not connected to the connection conductor, and the wide conductor is disposed across the boundary of the wiring substrate regions adjacent to each other.

An electronic component housing package of the present disclosure includes an insulating substrate including a first main surface, a second main surface opposite to the first main surface, and a third main surface disposed between the first main surface and the second main surface, the third main surface comprising a mount portion for mounting an electronic component, and a connection conductor for connecting to the electronic component. The electronic component housing package further includes a notch at an outer edge of the insulating substrate from the first main surface to the second main surface, the notch including a first notch and a second notch, and a plurality of external connection conductors at the insulating substrate on the second main surface. On the third main surface, an auxiliary conductor including a wide conductor and a narrow conductor is disposed on an inner surface of the notch, the wide conductor is disposed in a region connected to the connection conductor in a vicinity of the first notch, and both the narrow conductor and the wide conductor of the auxiliary conductor are disposed in a region not connected to the connection conductor in a vicinity of the second notch.

An electronic device according to the present disclosure includes the electronic component housing package described above and an electronic component mounted on the electronic component housing package.

DESCRIPTION OF EMBODIMENTS

Figure 1A:
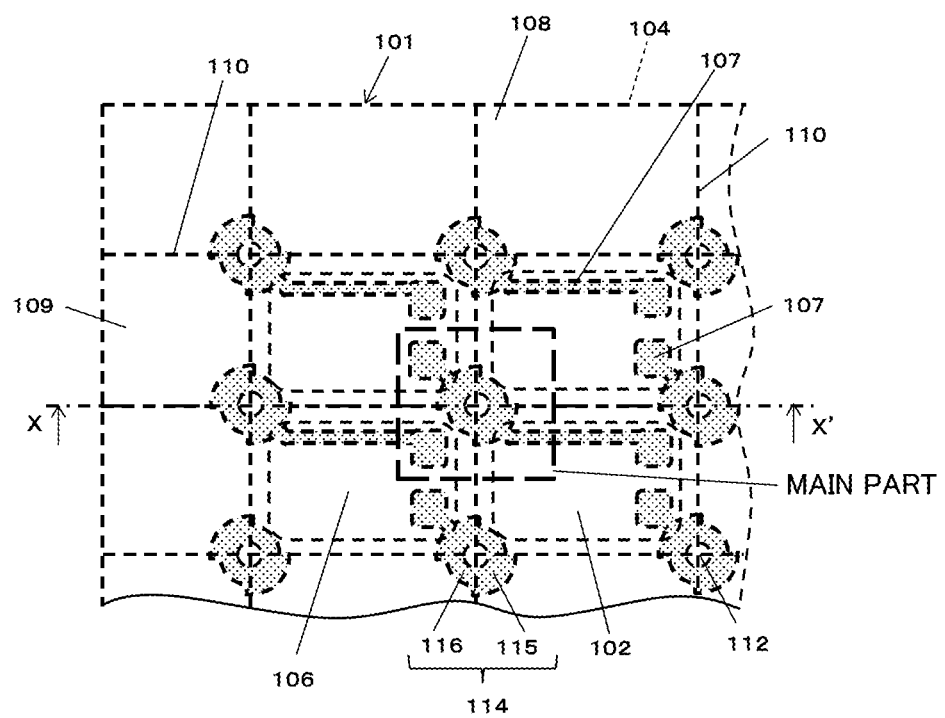
FIG. 1A is a plan perspective view illustrating a part of a multi-piece wiring substrate of the present embodiment.

A multi-piece wiring substrate and a wiring substrate that becomes an electronic component housing package according to the present disclosure will be described with reference to the accompanying drawings. In FIGS. 1 to 6, reference numeral 101 denotes a matrix substrate (multi-piece wiring substrate), 102 denotes a wiring substrate region that becomes an electronic component housing package, 103 denotes a first main surface, 104 denotes a second main surface, and 105 denotes an electronic component, 106 denotes a mount portion, 107 denotes a connection conductor, 108 denotes a third main surface, 109 denotes a margin region, 110 denotes a boundary, 111 denotes a dividing groove, 112 denotes a through-hole, 113 denotes an external connection conductor, 114 denotes an auxiliary conductor, 115 denotes a wide conductor, 116 denotes a narrow conductor, 117 denotes a base portion, 118 denotes a frame portion, 200 denotes a wiring substrate (electronic component housing package), 201 denotes an insulating substrate, 202 denotes a frame-shaped metallized layer, 203 denotes a lid, 204 denotes a notch, 205 denotes a first notch, 206 denotes a second notch, and 300 denotes an electronic device. In FIGS. 1 to 6, the same portions are denoted by the same reference numerals.

Each of wiring substrates 200 arranged on a matrix substrate 101 has a third main surface 108 including a concave mount portion 106, and an electronic component 105 is accommodated in the mount portion 106. The wiring substrate 200 includes a base portion 117 and a frame portion 118 laminated on the base portion 117. A frame-shaped metallized layer 202 is provided on the frame portion 118 at a first main surface 103, and a metal frame body (not illustrated) and a lid 203 made of metal are bonded to the frame-shaped metallized layer 202 by a brazing material. If a metal frame body is bonded to the frame-shaped metallized layer 202, a structure in which the lid 203 is further bonded to the metal frame body is obtained. The wiring substrate 200 includes a connection conductor 107 to which the electronic component 105 is connected, an external connection conductor 113, an auxiliary conductor 114, and the like. The electronic component 105 is bonded to the connection conductor 107 provided on the mount portion 106 of the wiring substrate 200 with a bonding material or the like and an electronic device 300 is formed.

Figure 1B:
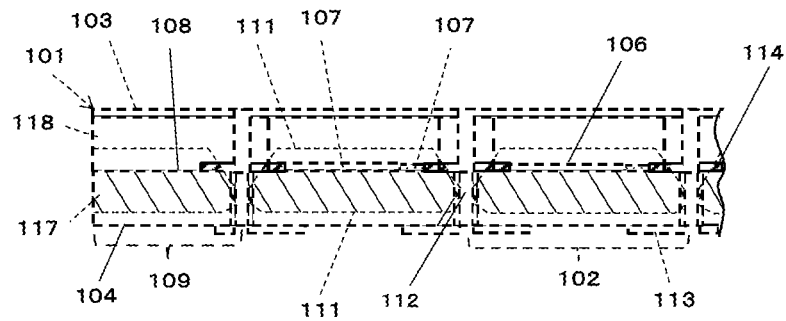
FIG. 1B is a sectional perspective view taken along line X-X' in FIG. 1A.

Such a wiring substrate 200 is generally manufactured in the form of a so-called multi-piece wiring substrate in which a plurality of wiring substrates 200 is obtained simultaneously and integratedly from a single matrix substrate 101 having a wide area. In the multi-piece wiring substrate, a plurality of wiring substrate regions 102 is arranged vertically and horizontally on the matrix substrate 101 made of, for example, an aluminum oxide sintered body. As illustrated in FIGS. 1A and 1B, in the matrix substrate 101, the wiring substrate regions 102 in which through-holes 112 are provided on the outer periphery are arranged. Further, the through-hole 112 provided on the outer periphery of each wiring substrate region 102 is provided with an inner surface conductor (not illustrated) on a part of the inner surface of the through-hole 112, and the auxiliary conductor 114 is provided around the through-hole 112 on the third main surface 108 including the mount portion 106. These inner surface conductors and auxiliary conductors 114 have a function of electrically connecting wiring conductors of adjacent wiring substrate regions 102 to each other. FIGS. 1A and 1B illustrate a structure in which the through-holes 112 are provided at the four corners of each wiring substrate region 102. The through-holes 112 may be formed at positions other than the four corners of each wiring substrate region 102, for example, at the central part on the long side and on the short side. With the internal conductors and auxiliary conductors 114 provided in and around the through-holes 112, the connection conductors 107 between the adjacent wiring substrate regions 102, the external connection conductor 113, and the like are connected and the wiring conductors of the matrix substrate 101 are integrally connected. Then, for example, by being led out to a plating conductor (not illustrated) provided on an outer edge portion of a margin region 109 of the matrix substrate 101, electricity is supplied from the plating conductor, and a metal layer is deposited on the external connection conductor 113 or the like by electroplating.

The matrix substrate 101 is made of, for example, a ceramic sintered body such as an aluminum oxide sintered body, a glass ceramic sintered body, an aluminum nitride sintered body, a silicon carbide sintered body, a silicon nitride sintered body, or a mullite sintered body.

The matrix substrate 101 is manufactured by laminating a plurality of ceramic insulating layers and integrally firing the laminated body. That is, if the matrix substrate 101 is made of an aluminum oxide sintered body, the matrix substrate is manufactured as follows. First, an appropriate organic solvent and a binder are added to a raw material powder containing glass components such as aluminum oxide and silicon oxide and formed into a sheet shape to manufacture a plurality of ceramic green sheets. Next, after punching a part of the ceramic green sheet to form a ceramic green sheet provided with a plurality of frame portions, the ceramic green sheet provided with the plurality of frame portions is laminated on a flat ceramic green sheet that has not been punched. Thereafter, if the laminate is integrally fired, the matrix substrate 101 in which wiring substrate regions 102 are vertically and horizontally arranged can be manufactured. The wiring substrate regions 102 are formed by laminating a plurality of ceramic insulating layers. In this case, the punched ceramic green sheet becomes the frame portion 118, and the ceramic green sheet not punched becomes the base portion 117.

The wiring substrate 200 that becomes an electronic component housing package includes the mount portion 106 (concave portion) for the electronic component 105 at the center of the upper surface thereof. The base portion 117 and the frame portion 118 act as a container for protecting the electronic component 105 in the mount portion 106. As the electronic component 105 in the mounting portion 106, various electronic components such as a piezoelectric vibrator such as a crystal oscillator, a surface acoustic wave element, a semiconductor element (IC), a capacitor element, an inductor element, and a resistor can be included.

For example, if the electronic component 105 is the crystal oscillator and the electronic device 300 is a crystal device, the wiring substrate 200 having such a form is used as a package for an oscillator that serves as a reference for frequency and time in an electronic device such as a communication device such as a mobile phone and smart phones, an information device such as a computers and an IC card, and the electronic device 300 in this case is used as an oscillator. The electronic component 105 in the mount portion 106 is electrically connected to the connection conductor 107 on the third main surface 108 by a bonding material such as a conductive adhesive.

The wiring substrate 200 is manufactured in a so-called multi-piece form and separated into individual parts. For example, the plurality of wiring substrate regions 102 having mount portions 106 is arranged vertically and horizontally on the matrix substrate 101 in which a plurality of ceramic insulating layers is laminated. A dividing groove 111 is formed on the upper surface of the matrix substrate 101 by a laser (not illustrated) along a boundary 110 of the wiring substrate regions 102, and for example, a multi-piece wiring substrate as illustrated in FIGS. 1A and 1B is basically configured. Such a matrix substrate 101 is separated along the dividing groove 111 in the wiring substrate region 102, and the wiring substrate 200 that becomes an electronic component housing package is manufactured.

Figure 2:
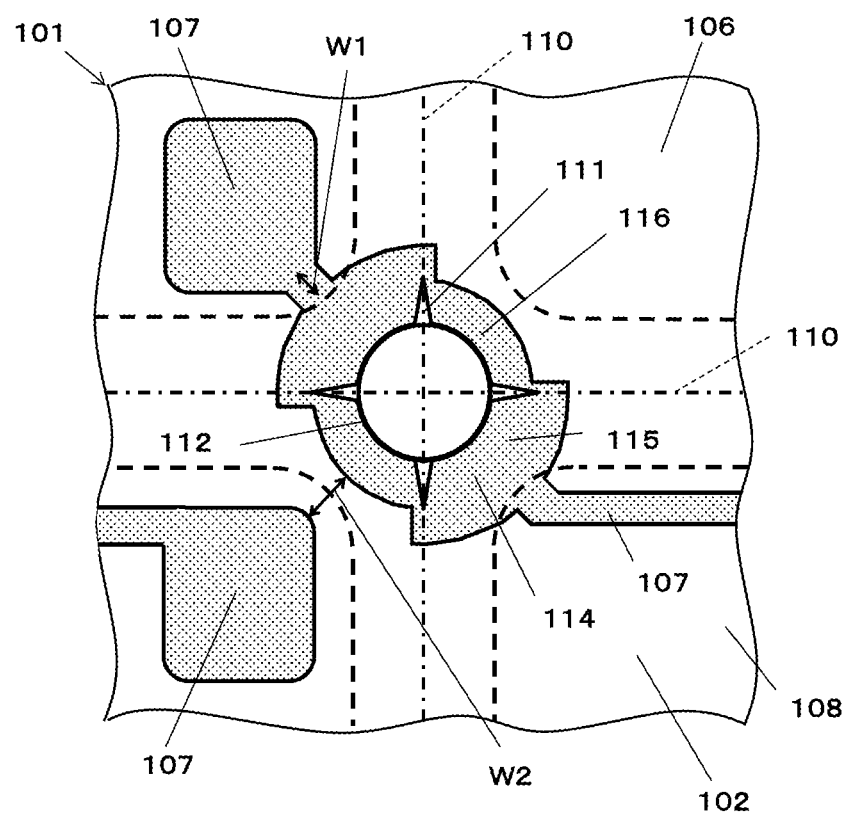
FIG. 2 is a main part enlarged view illustrating a main part of the multi-piece wiring substrate of the present embodiment.

As illustrated in FIGS. 1 and 2, in order to separate the matrix substrate 101, the dividing groove 111 is formed on the first main surface 103 and a second main surface 104 of the matrix substrate 101 along the boundary 110 of the wiring substrate region 102 by the laser. The dividing groove 111 is also formed on the third main surface 108 (a boundary portion between the base portion 117 and the frame portion 118) provided between the first main surface 103 and the second main surface 104 of the matrix substrate 101. This is because the through-hole 112 is provided across the boundary 110 between the wiring substrate regions 102 or the boundary 110 between the wiring substrate regions 102 and the margin region 109 if the dividing groove 111 is formed by the laser along the boundary 110 of the wiring substrate region 102, and the dividing groove 111 is also formed on the third main surface 108 as well, as a result of irradiation of laser on the inner surface conductor on a part of an inner surface of the through-hole 112 as well. As illustrated in FIGS. 1 and 2, in the thickness direction of the matrix substrate 101, the depth of the dividing groove 111 is increased as it is closer to the inner surface of the through-hole 112. The dividing groove 111 is configured by, for example, dividing grooves 111 on both surfaces including a dividing groove 111 on the first main surface 103 side and a dividing groove 111 on the second main surface 104 side, and is provided in a lattice shape between the wiring substrate regions 102 of the matrix substrate 101 and between the wiring substrate regions 102 and the margin region 109. Then, by applying stress to the matrix substrate 101 at a portion (such as the boundary 110 between the wiring substrate regions 102) where each dividing groove 111 is formed and bending the matrix substrate 101 in the thickness direction, the matrix substrate 101 is separated into individual wiring substrates 200. The dividing groove 111 provided in the matrix substrate 101 may be provided only on one side on the first main surface 103 side, or may be provided only on one side on the second main surface 104 side.

The wiring conductors such as the connection conductor 107 are formed on the inside and on the surface of the wiring substrate 200 from the bottom (third main surface 108) of the mount portion 106 to the lower surface (second main surface 104) of the wiring substrate 200. Among these wiring conductors, a portion formed on the second main surface 104 of the wiring substrate 200 is, for example, the external connection conductor 113. Among the wiring conductors, those formed inside the wiring substrate 200 are through conductors (so-called via conductors, and the like), the auxiliary conductors 114, portions, that are not exposed, of the connection conductors 107 for connecting the electronic components 105, and the like. By electrically connecting the electronic component 105 on the mount portion 106 to the connection conductor 107, the electronic component 105 is electrically connected to an external electric circuit (not illustrated) via the connection conductor 107, the auxiliary conductor 114, the external connection conductor 113, and the like.

These wiring conductors are made of a metal material such as copper, silver, palladium, gold, platinum, tungsten, molybdenum, manganese, or an alloy containing these materials. For example, if the wiring conductor is made of molybdenum, which is high melting point metal, the wiring conductor can be formed by applying a metal paste (not illustrated) manufactured by adding an organic solvent and a binder to molybdenum powder in a predetermined pattern onto a ceramic green sheet that becomes the wiring substrate 200 and simultaneous firing.

In the multi-piece wiring substrate (matrix substrate 101) described above, a metallized conductor layer that becomes the external connection conductor 113 of the wiring substrate 200 after the division is formed at each corner of the lower surface of each wiring substrate region 102. For example, the outer periphery of the external connection conductor 113 is in contact with an inner surface conductor in the through-hole 112. The external connection conductor 113 is made of, for example, a metal such as tungsten or molybdenum, and for example, if the external connection conductor 113 is made of a metallized conductor layer of molybdenum, the external connection conductor 113 can be formed by printing a metal paste manufactured by adding an organic solvent, a binder or the like to molybdenum powder in a predetermined pattern on the lower surface of the ceramic green sheet that becomes the base portion 117 of a ceramic insulating layer. For example, the metal paste is formed by a screen printing method or the like so that the thickness of the external connection conductor 113 after firing becomes about 8 to 20 μm.

A metal frame body (not illustrated) may be further bonded to the upper surface of the frame-shaped metallized layer 202 on the first main surface 103 by a brazing material. The bonding of the metal frame body may be performed in a state of a multi-piece wiring substrate, or may be performed in a state of an individual electronic component housing package (wiring substrate 200). If productivity is taken into consideration, the bonding is performed in a multi-piece state. Then, the lid 203 made of metal is bonded to the metal frame body, and the electronic component 105 is sealed in the mount portion 106. In the example of the present embodiment, a metal layer (not illustrated) such as a nickel plating layer and a gold plating layer is sequentially deposited on the exposed surfaces of the frame-shaped metallized layer 202, the connection conductor 107, the external connection conductor 113, and the like. For example, the nickel plating layer is formed with a thickness of about 1.0 to 20 μm, and the gold plating layer is formed with a thickness of about 0.1 to 1.0 μm. By these plating layers, the exposed surface of each wiring conductor is covered with the metal layer, and thus a corrosion prevention effect is obtained and a wiring conductor with good wettability of solder and brazing material is attained.

The multi-piece wiring substrate according to the present disclosure includes the matrix substrate 101 including the first main surface 103, the second main surface 104 opposite to the first main surface 103, the third main surface 108 disposed between the first main surface 103 and the second main surface 104, the third main surface comprising the mount portion 106 for mounting the electronic component 105, and the connection conductor 107 for connecting to the electronic component 105, an arrangement of the plurality of wiring substrate regions 102, the margin region 109 surrounding the plurality of wiring substrate regions 102, and the dividing groove 111 on the first main surface 103 and the second main surface 104 along the boundary 110 between the wiring substrate regions 102 and the boundary 110 between the wiring substrate regions 102 and the margin region 109; the through-hole 112 disposed across the boundary 110 between the wiring substrate regions 102 or the boundary 110 between the wiring substrate regions 102 and the margin region 109 and which penetrates from the first main surface 103 to the second main surface 104, and the external connection conductor 113 which is disposed at each corner of the wiring substrate regions 102 on the second main surface 104, in which the auxiliary conductor 114 is disposed around the through-hole 112 on the third main surface 108, the auxiliary conductor 114 includes the wide conductor 115 disposed on the side connected to the connection conductor 107 and the narrow conductor 116 disposed on the side not connected to the connection conductor 107, and the wide conductor 115 is disposed across the boundary 110 of the wiring substrate regions 102 adjacent to each other.

Due to such a structure, even if the wiring substrate 200 that becomes an electronic component housing package is reduced in size, if the dividing groove 111 is formed by the laser along the boundary 110 between the wiring substrate regions 102, the wide conductor 115 is irradiated with the laser, and thus disconnection of the auxiliary conductor 114 can be suppressed. That is, as illustrated in FIG. 1B, for example, if the dividing groove 111 is formed from the first main surface 103 of the matrix substrate 101 with the laser, the laser is irradiated in the thickness direction of the through-hole 112 if the laser moves through the through-hole 112 along the boundary 110 of each wiring substrate region 102 in the vicinity of the surface of the through-hole 112, and thus there exists a region where the depth of the dividing groove 111 increases as the distance to the through-hole 112 increases. For that reason, even if the depth of the dividing groove 111 provided in the boundary 110 excluding the region near the through-hole 112 of the wiring substrate region 102 is formed to be smaller than the depth from the first main surface 103 to the auxiliary conductor 114 in the thickness direction of the matrix substrate 101, there is a possibility that the depth of the dividing groove 111 may be increased in a region near the through-hole 112 of the wiring substrate region 102, and the auxiliary conductor 114 may be disconnected. Even if the inner surface conductor is provided in the through-hole 112, the inner surface conductor is easily disconnected by the laser because the inner surface conductor (not illustrated) has a small thickness. Therefore, if the auxiliary conductor 114 is disconnected, there is a possibility that a conduction path between the adjacent wiring substrate regions 102 via the auxiliary conductor 114, the inner surface conductor, and the like may not be secured.

However, as illustrated in a plan perspective view in FIG. 2, since a structure is adopted in which the auxiliary conductor 114 includes the wide conductor 115 provided on the side connected to the connection conductor 107 and the narrow conductor 116 provided on the side not connected to connection conductor 107, and the wide conductor 115 is provided across the boundary 110 between the adjacent wiring substrate regions 102, even if the auxiliary conductor 114 is irradiated with the laser, the wide conductor 115 is irradiated with the laser, and since the wide conductor 115 has a sufficient width to prevent disconnection, the disconnection of the auxiliary conductor 114 can be suppressed. If the auxiliary conductor 114 is not disconnected, the conduction path between adjacent wiring substrate regions 102 is secured even if the inner surface conductor is disconnected.

In the matrix substrate 101, inner surface conductors for connecting the wiring conductors between the wiring substrate regions 102 arranged on the multi-piece wiring substrate are provided on the inner surface of the through-hole 112 on the second main surface 104 side, and as illustrated in FIG. 1B, if the inner surface conductor is provided so that the depth of the dividing groove 111 on the first main surface 103 side is increased and the depth of the dividing groove 111 on the second main surface 104 side is decreased, it becomes difficult for the inner surface conductor to be irradiated with laser, and disconnection of the inner surface conductor by the laser can be suppressed.

Since the auxiliary conductor 114 includes the wide conductor 115 on the side connected to the connection conductor 107 and the narrow conductor 116 on the side not connected to the connection conductor 107, on the side connected to the connection conductor 107, an interval W1 between the wide conductor 115 of the auxiliary conductor 114 and the connection conductor 107 can be reduced. Thus, conduction can be satisfactorily performed. On the side not connected to the connection conductor 107, an interval W2 between the narrow conductor 116 of the auxiliary conductor 114 and the connection conductor 107 can be increased. Thus insulation can be satisfactorily performed. Such contradictory effects can be attained with the auxiliary conductor 114. That is, if the auxiliary conductor (not illustrated) is formed with the same width on the entire circumference as in the related art, it is necessary to increase the width of the auxiliary conductor in order to suppress the disconnection of the auxiliary conductor if forming the dividing groove 111 by laser, but the electronic component housing packages are further reduced in size, the interval between the auxiliary conductor and the connection conductor 107 provided near the mount portion 106 is reduced, and if the electronic component 105 such as a piezoelectric vibration element is mounted on the connection conductor 107 with a bonding material or the like, there is a possibility of short-circuiting due to the flow of the bonding material or the like.

However, as illustrated in FIG. 2, since the structure is adopted in which the auxiliary conductor 114 includes the wide conductor 115 provided on the side connected to the connection conductor 107 and the narrow conductor 116 provided on the side not connected to the connection conductor 107, the conduction between the connection conductor 107 and the auxiliary conductor 114 can be satisfactorily performed by the wide conductor 115 of the auxiliary conductor 114, on the side connected to the connection conductor 107 and the insulation between the connection conductor 107 and the auxiliary conductor 114 can be satisfactorily performed by the narrow conductor 116 of the auxiliary conductor 114, on the side not connected to the connection conductor 107.

In the multi-piece wiring substrate of the present embodiment, the through-holes 112 are provided at the four corners of the wiring substrate region 102. With such a structure, even if the dividing groove 111 is formed by the laser, each wiring substrate region 102 can be efficiently connected via the auxiliary conductor 114 provided around the through-holes 112 at the four corners of the wiring substrate region 102 while suppressing the disconnection of the auxiliary conductor 114, and a metal layer can be satisfactorily deposited by electroplating on the wiring conductor exposed to each wiring substrate region 102. That is, between the wiring substrate regions 102 arranged on the multi-piece wiring substrate, since each wiring conductor is integrally connected as illustrated in FIGS. 1A and 1B by the auxiliary conductor 114 provided around the through-holes 112 at the four corners of the wiring substrate region 102, the inner surface conductor provided on the inner surface of the through-hole 112, a connection conductor 107, and the like, the through-hole 112 can be used to chamfer the four corners of the wiring substrate region 102, and at the same time, the inner surface of the through-hole 112 can be used as connection means between the wiring substrate regions 102.

A part of a conductive path for electrically connecting the electronic component 105 and an external electric circuit (not illustrated) is formed by connecting the connection conductor 107 on the mount portion 106 of each wiring substrate region 102 via the auxiliary conductor 114 and a through conductor (not illustrated) or the inner surface conductor of the through-hole 112 to the external connection conductor 113 on the second main surface 104 of each wiring substrate region 102. For example, as illustrated in FIG. 1A and FIG. 2, the width (in a plan view, the distance between the inner circumference of the auxiliary conductor 114 and the outer edge of the wide conductor 115 provided across the boundary 110) of the auxiliary conductor 114 around the through-hole 112 at the boundary 110 between the wiring substrate regions 102 and the boundary 110 between each wiring substrate region 102 and the margin region 109 is larger than that of the auxiliary conductor of the related art. For that reason, even if a part of the auxiliary conductor 114 is cut if the dividing groove 111 is formed by the laser, a region on the outer edge of the wide conductor 115 is secured as a conduction path.

Therefore, even if the wiring substrate region 102 that becomes an electronic component housing package is reduced in size, since the wiring substrate regions 102 can be efficiently connected to each other via the auxiliary conductors 114 around the through-holes 112 at the four corners of the wiring substrate region 102 and a metal layer such as a nickel plating layer or a gold plating layer can be satisfactorily deposited by electroplating to the wiring conductor exposed in each wiring substrate region 102, connection reliability between the connection conductor 107 and the electronic component 105 and connection reliability between the external connection conductor 113 and the external electric circuit can be improved.

If the size of the wiring substrate 200 is, for example, 1.2 mm (long side length)×1.0 mm (short side length), the size of the through-hole 112 at the boundary 110 between the wiring substrate regions 102 and the boundary 110 between each wiring substrate region 102 and the margin region 109 is about φ0.10 to 0.15 mm, and in the auxiliary conductor 114 around the through-hole 112, the width of the narrow conductor 116 is about 0.03 to 0.05 mm, and the width of the wide conductor 115 is about 0.06 to 0.12 mm. Then, in order to prevent the auxiliary conductor 114 from being cut by the laser, the wide conductor 115 is provided such that the width of the wide conductor 115 is larger than the horizontal distance in a cross-sectional view between a region in which the dividing groove 111 starts to change deeply in the vicinity of the through-hole 112 and the inner surface of the through-hole 112.

In the multi-piece wiring substrate of the present embodiment, the wiring substrate region 102 is rectangular in a plan view, and the through-hole 112 is provided on the short side or the long side of the wiring substrate region 102. With such a structure, even in a structure in which a large number of connection conductors 107 are provided or the connection conductors 107 are separated from the four corners of the wiring substrate 200, the positions of the through-holes 112 and the auxiliary conductors 114 can be freely moved on the short side or the long side of the wiring substrate region 102 to appropriately move the positions of the connection conductors 107.

Figure 3:
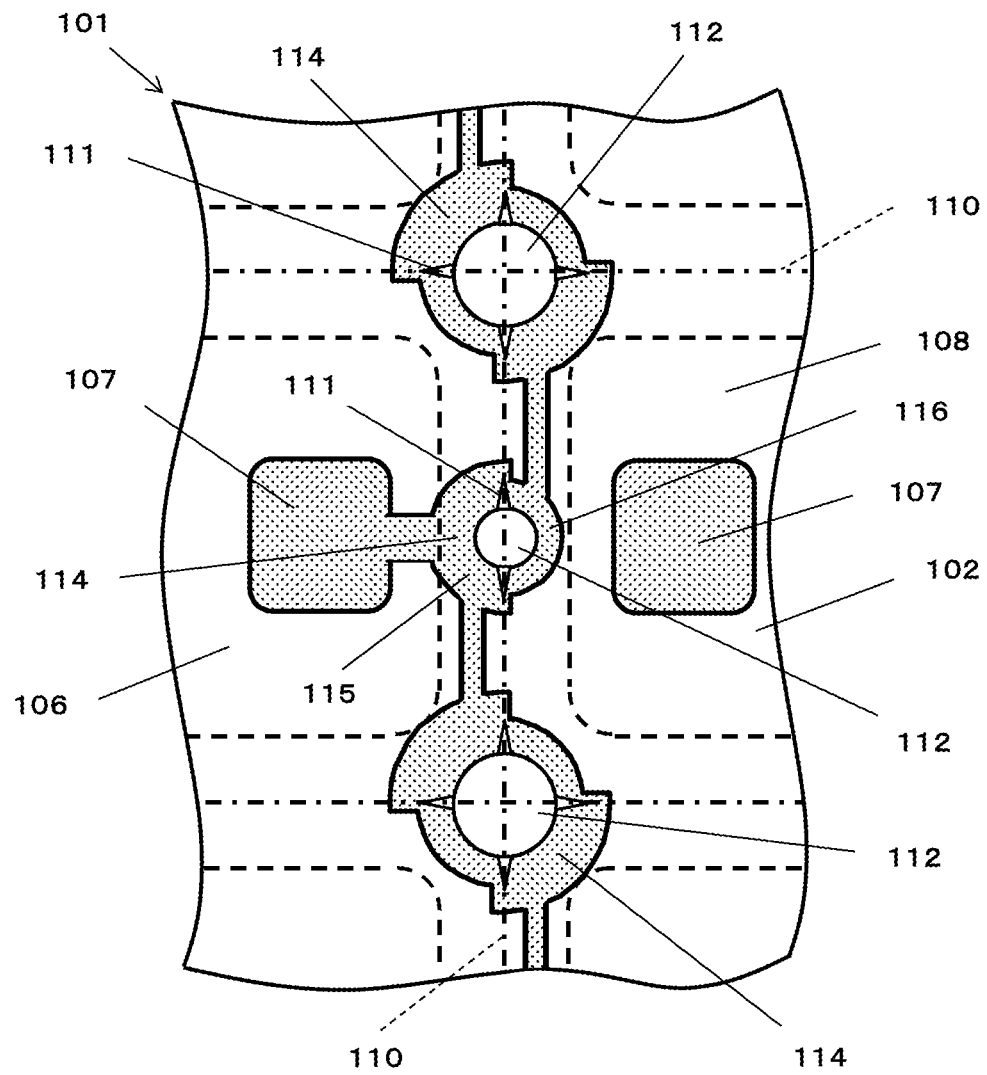
FIG. 3 is a main part enlarged view illustrating a main part of a multi-piece wiring substrate according to another embodiment.

That is, for example, if the connection conductor 107 connected to the auxiliary conductor 114 is to be provided on the short side of the wiring substrate region 102, as illustrated in FIG. 3, the through-hole 112 may be provided across the boundary 110 in the center of the short side between the wiring substrate regions 102, the auxiliary conductor 114 may be provided around the through-hole 112, and the auxiliary conductor 114 may be provided so that the conductor 115 is provided on the side connected to the connection conductor 107, the narrow conductor 116 is provided on the side not connected to the connection conductor 107, and both ends of the wide conductor 115 are provided across the boundary 110 between the wiring substrate regions 102. With such a structure, even if the dividing groove 111 is formed with the laser at the boundary 110 on the short side of the wiring substrate region 102, the wiring substrate regions 102 can be efficiently connected to each other via the auxiliary conductor 114 around each through-hole 112 of the wiring substrate region 102 while suppressing the disconnection of the auxiliary conductor 114, and a metal layer can be satisfactorily deposited by electroplating to the wiring conductor exposed in each wiring substrate region 102.

Furthermore, as illustrated in FIG. 3, since the auxiliary conductor 114 includes the wide conductor 115 provided on the side connected to the connection conductor 107 and the narrow conductor 116 provided on the side not connected to the connection conductor 107. Since the interval between the wide conductor 115 and the connection conductor 107 of the auxiliary conductor 114 can be reduced on the side connected to the connection conductor 107, conduction between the connection conductor 107 and the wide conductor 115 can be satisfactorily performed. On the other hand, since the interval between the narrow conductor 116 and the connection conductor 107 of the auxiliary conductor 114 can be increased on the side not connected to the connection conductor 107, insulation between the connection conductor 107 and the narrow conductor 116 can be satisfactorily performed. Such contradictory effects can be attained in the auxiliary conductor 114 provided on the short side or the long side of the wiring substrate region 102. In FIG. 3, although the wiring substrate region 102 having a structure in which one through-hole 112 and one connection conductor 107 are provided on the short side is illustrated, a structure in which a plurality of through-holes 112 and a plurality of connection conductors 107 are provided on the short side or the long side may be allowed, and a structure in which a plurality of through-holes 112 and a plurality of connection conductors 107 are provided on both the short side and the long side may be allowed.

A step of forming the dividing grooves 111 with the laser may be performed on the fired matrix substrate 101, but the step may be performed at a stage of a laminate of a plurality of ceramic sheets, that is, an unfired laminate that becomes the matrix substrate 101 is preferable for the step of forming the dividing grooves 111. By forming the dividing grooves 111 with the laser before firing the laminate, workability is good, and adhesion of a molten material by the laser can be suppressed. Specific examples of the type of laser to be used may include UV lasers, green lasers, IR lasers, or the like. The output per unit area (unit area of a surface of a workpiece at a site irradiated with the laser) of the laser during laser processing is relatively small, and an amount of the molten material generated is small accordingly. In this case, the molten material generated by the laser is easily removed in the matrix substrate 101 containing an organic material such as a binder before firing than in the sintered matrix substrate 101. For that reason, it is possible to form the dividing groove 111 having a good shape even with the laser having a relatively small energy as described above.

In the multi-piece wiring substrate of the present embodiment, the wide conductor 115 is provided on the third main surface 108 by being exposed to the mount portion 106. With such a structure, on the side where the auxiliary conductor 114 is connected to the connection conductor 107, the interval (W1) between the wide conductor 115 of the auxiliary conductor 114 and the connection conductor 107 can be further reduced, and the connection between the connection conductor 107 and the wide conductor 115 can be further improved. The auxiliary conductor 114 is provided at the boundary between the base portion 117 and the frame portion 118 in the thickness direction of the matrix substrate 101 and the wide conductor 115 is exposed to the mount portion 106 on the third main surface 108 even if the thickness of the wide conductor 115 is reduced by being pressurized if the base portion 117 and the frame portion 118 are laminated if the matrix substrate 101 is manufactured, and thus the width of the conduction path is secured, and a good conduction state between the connection conductor 107 and the wide conductor 115 can be maintained.

The connection conductor 107 and the auxiliary conductor 114 can be formed by printing in a predetermined pattern on the upper surface of the ceramic green sheet that becomes the base portion 117 of the ceramic insulating layer. For example, the metal paste is formed by a screen printing method or the like so that the thickness of the connection conductor 107 and the auxiliary conductor 114 after firing is about 8 to 12 μm. If the matrix substrate 101 is manufactured, the ceramic green sheet that becomes the base portion 117 and the ceramic green sheet that becomes the frame portion 118 are pressurized during lamination so as to be brought into close contact and integrated with each other. In the pressurized laminate that becomes the matrix substrate 101, the auxiliary conductor 114 provided at the boundary between the base portion 117 and the frame portion 118 in the thickness direction of the matrix substrate 101 is pressurized and, as a result, the thickness of the wide conductor 115 becomes smaller than that during printing. However, if the wide conductor 115 is provided on the third main surface 108 and is exposed to the mount portion 106 as described above, a structure in which the width of the wide conductor 115 at the boundary between the base portion 117 and the frame portion 118 is large is obtained, the width of the conduction path is easily secured, and a good conduction state between the connection conductor 107 and the wide conductor 115 can be maintained.

In the multi-piece wiring substrate of the present embodiment, the narrow conductor 116 is not exposed to the mount portion 106 on the third main surface 108 and is covered with the frame portion 118 provided on the third main surface 108. With such a structure, the auxiliary conductor 114 includes the wide conductor 115 provided on the side connected to the connection conductor 107 and the narrow conductor 116 provided on a side not connected to the connection conductor 107, not exposed to the mount portion 106 on the third main surface 108, and covered with the frame portion 118 provided on the third main surface 108. On the side where the connection conductor 107 and the auxiliary conductor 114 are connected, the interval (W1) between the wide conductor 115 of the auxiliary conductor 114 and the connection conductor 107 can be reduced and conduction between the connection conductor 107 and the wide conductor 115 can be satisfactorily performed. A structure is obtained in which, on the side where the auxiliary conductor 114 is not connected to the connection conductor 107, the interval (W2) between the narrow conductor 116 of the auxiliary conductor 114 and the connection conductor 107 can be further increased, and all of the narrow conductors 116 are covered with the frame portion 118.

Therefore, on the side where the connection conductor 107 is connected to the wide conductor 115, conduction between the connection conductor 107 and the wide conductor 115 can be satisfactorily performed. Further, insulation between the connection conductor 107 and the narrow conductor 116 can be performed more satisfactorily by suppressing a short circuit due to the flow of the bonding material if the electronic component 105 such as a piezoelectric vibration element is more effectively mounted on the connection conductor 107 with the bonding material or the like. Such contradictory effects can be attained with the auxiliary conductor 114.

Figure 4A:
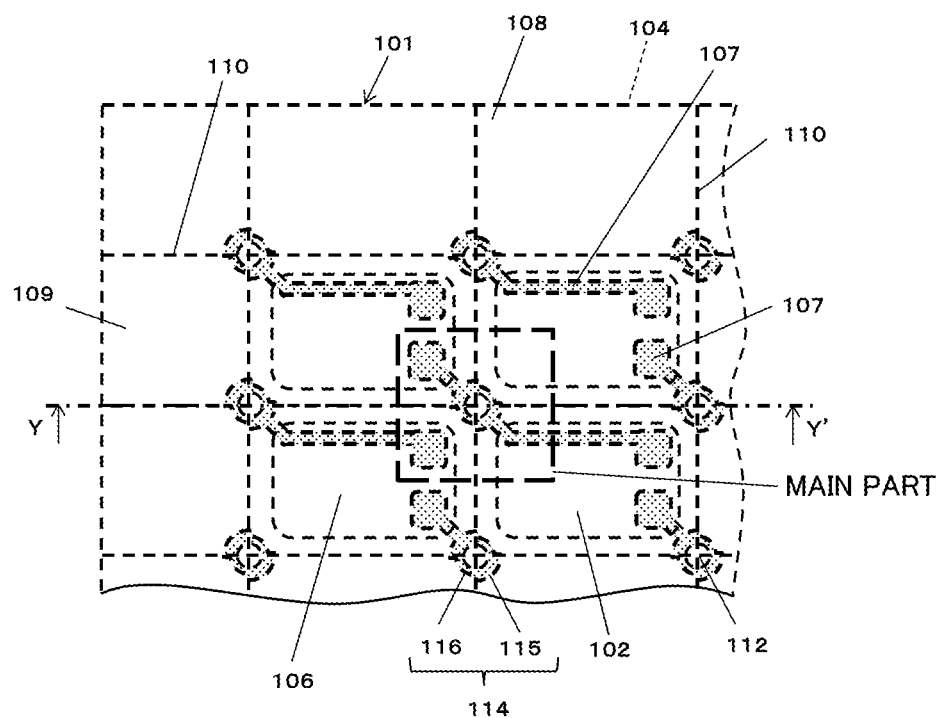
FIG. 4A is a plan perspective view illustrating a part of a multi-piece wiring substrate according to another embodiment.
Figure 4B:
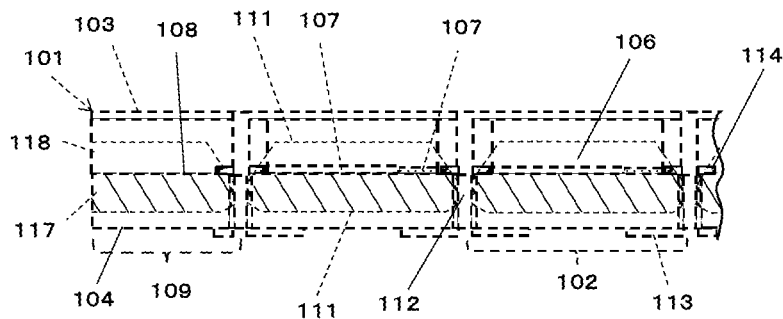
FIG. 4B is a sectional perspective view taken along line Y-Y' in FIG. 4A.

One example of such a multi-piece wiring substrate is illustrated in FIGS. 4A and 4B. The multi-piece wiring substrate has a structure in which the narrow conductor 116 is not exposed to the mount portion 106 on the third main surface 108 and is covered with the frame portion 118 (illustrated in a plan perspective view) provided on the third main surface 108. In each wiring substrate region 102, the auxiliary conductor 114 includes the wide conductor 115 provided on the side connected to the connection conductor 107 and the narrow conductor 116 provided on the side not connected to the connection conductor 107, not exposed to the mount portion 106 on the third main surface 108, and covered with the frame portion 118 provided on the third main surface 108.

A plurality of wiring substrate regions 102 having the mount portions 106 is arranged vertically and horizontally on the matrix substrate 101 (multi-piece wiring substrate) in which a plurality of ceramic insulating layers is laminated, and the dividing groove 111 is formed on the upper surface (first main surface 103) of the matrix substrate 101 by the laser along the boundary 110 between adjacent wiring substrate regions 102 or the boundary 110 between the wiring substrate regions 102 and the margin region 109. Furthermore, the dividing groove 111 is formed on the lower surface (second main surface 104) of the matrix substrate 101 by the laser along the boundary 110 between the wiring substrate regions 102 or the boundary 110 between the wiring substrate regions 102 and the margin region 109 so as to face the dividing groove 111 on the upper surface. In the matrix substrate 101, inner surface conductors (not illustrated) for connecting the wiring conductors between the wiring substrate regions 102 arranged on the multi-piece wiring substrate are formed in the inner surface of the through-holes 112 on the second main surface 104 side and, as illustrated in FIG. 4B, the dividing groove 111 is provided so that the depth of the dividing groove 111 on the first main surface 103 is increased and the depth of the dividing groove 111 on the second main surface 104 is decreased, thereby making it difficult for the inner surface conductor to be irradiated with the laser, and the disconnection of the inner surface conductor by the laser can be suppressed.

In order to obtain a structure in which the narrow conductor 116 is not exposed to the mount portion 106 on the third main surface 108 and is covered with the frame portion 118 provided on the third main surface 108, even if the width of the narrow conductor 116 is reduced, if the width of the wide conductor 115 provided on the side connected to the connection conductor 107 and provided across the boundary 110 between the adjacent wiring substrate regions 102 is sufficiently secured, the wide conductor 115 is irradiated with the laser even if the auxiliary conductor 114 including the narrow conductor 116 having a small width is irradiated with the laser. Further, the wide conductor 115 has a width sufficient to suppress disconnection, and thus the disconnection of the auxiliary conductor 114 can be suppressed.

That is, as illustrated in FIGS. 4A and 4B, if the dividing groove 111 is formed on the upper surface (first main surface 103) of the matrix substrate 101 by the laser along the boundary 110 between the wiring substrate regions 102, in the vicinity of the surface of the through-hole 112, since the laser is irradiated in the thickness direction of the through-hole 112 if the laser moves through the through-hole 112 along the boundary 110 between the wiring substrate regions 102, there is a region where the depth of the dividing groove 111 changes deeper as it is closer to the through-hole 112. For that reason, even if the dividing groove 111 provided in the boundary 110 excluding the region near the through-hole 112 of the wiring substrate region 102 is formed to be smaller than the depth from the first main surface 103 to the auxiliary conductor 114 in the thickness direction of the matrix substrate 101, the depth of the dividing groove 111 is larger than the depth from the first main surface 103 to the auxiliary conductor 114 in the region near the through-hole 112 of the wiring substrate region 102. However, since the wide conductor 115 has a sufficient width to suppress disconnection as described above, even if the through-hole 112 side of the wide conductor 115 of the auxiliary conductor 114 in a plan view is cut by the laser, the structure is maintained in which the auxiliary conductors 114 between the adjacent wiring substrate regions 102 are integrally connected in the uncut portion of the wide conductor 115, and thus disconnection of the auxiliary conductor 114 can be suppressed.

Figure 5:
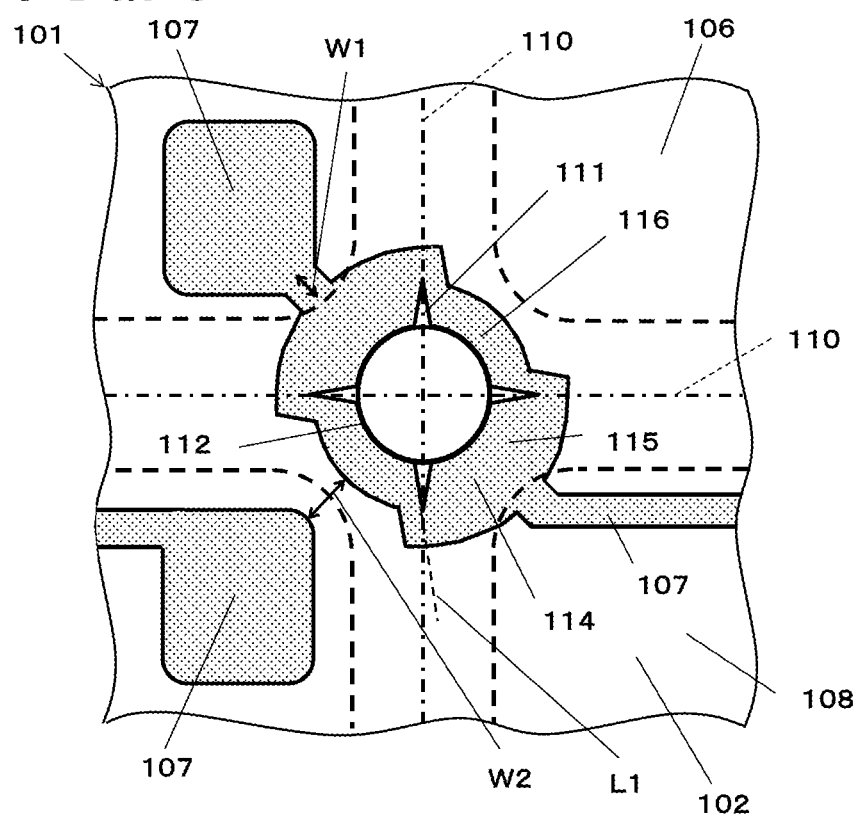
FIG. 5 is a main part enlarged view illustrating a main part of a multi-piece wiring substrate according to another embodiment.

Here, an example is illustrated in which the shape of the wide conductor 115 is a straight line shape along the boundary 110 at both ends of the wide conductor 115. However, for example, as illustrated in FIG. 5, for example, at both ends of the wide conductor 115, if a shape along the extension (L1) of the outer edge of the dividing groove 111 adjacent to the ends of the wide conductor 115 is employed, that is, a line connecting the outer edge of the wide conductor 115 and the outer edge of the narrow conductor 116 is shaped along the extension (L1) of the outer edge of the adjacent dividing groove 111, the minimum width portion of the conductor is not formed between the outer edge of the dividing groove 111 and the wide conductor 115. The width of the uncut portion of the wide conductor 115 can be left larger, and thus a structure is more reliably maintained in which the auxiliary conductors 114 between adjacent wiring substrate regions 102 are integrally connected. Therefore, the disconnection of the auxiliary conductor 114 can be more effectively suppressed. The shape along the outer edge of the dividing groove 111 at both ends of the wide conductor 115 is not limited to a straight line but may be a curved line.

The electronic component housing package (wiring substrate 200) of the present embodiment includes an insulating substrate 201, the first main surface 103, the second main surface 104 opposite to the first main surface 103, the third main surface 108 disposed between the first main surface 103 and the second main surface 104, the third main surface comprising the mount portion 106 for mounting the electronic component 105, and the connection conductor 107 for connecting to the electronic component 105, a notch 204 at an outer edge of the insulating substrate 201 from the first main surface 103 to the second main surface 104, the notch including a first notch 205 and a second notch 206, and the plurality of external connection conductors 113 at the insulating substrate 201 on the second main surface 104, in which, on the third main surface 108. On the third main surface 108, the auxiliary conductor 114 including the wide conductor 115 and the narrow conductor 116 is disposed on an inner surface of the notch 204, the wide conductor 115 is disposed in a region connected to the connection conductor 107 in the vicinity of the first notch 205, and both the narrow conductor 116 and the wide conductor 115 of the auxiliary conductor 114 are disposed in a region not connected to the connection conductor 107 in the vicinity of the second notch 206.

With such a structure, an electronic component housing package can be provided in which the interval (W2) between the narrow conductor 116 and the connection conductor 107 can be increased and the metal layer can be satisfactorily deposited by electroplating on the exposed wiring conductor while securing the conduction path with the wide conductor 115, and short-circuiting with the connection conductor 107 not connected to the auxiliary conductor 114 can be suppressed. That is, if the dividing groove 111 is provided on the matrix substrate 101 by the laser in order to manufacture the electronic component housing package 200, even if the deep groove portion is formed by irradiating also the exposed inner surface of the through-hole 112 with the laser in the vicinity of the through-hole 112 that becomes the notch 204, the auxiliary conductor 114 including the wide conductor 115 and the narrow conductor 116 is provided on the inner surface of the notch 204, the metal layer can be satisfactorily deposited by electroplating on the exposed wiring conductor while securing the conduction path with the wide conductor 115, and short-circuiting with the connection conductor 107 not connected to the auxiliary conductor 114 can be suppressed.

The electronic component housing package 200 includes the base portion 117 and the frame portion 118 laminated on the base portion 117, and the auxiliary conductor 114 is provided in a region where the base portion 117 and the frame portion 118 are laminated. The auxiliary conductor 114 is formed by a screen printing method or the like so that the thickness of the auxiliary conductor 114 after firing is about 8 to 12 μm. Then, if manufacturing the matrix substrate 101 on which the electronic component housing packages 200 are arranged, the ceramic green sheet that becomes the base portion 117 and the ceramic green sheet that becomes the frame portion 118 are pressurized so as to be brought into close contact and integrated with each other. For that reason, since the auxiliary conductor 114 at the boundary between the base portion 117 and the frame portion 118 in the thickness direction of the matrix substrate 101 is also pressurized in the pressurized laminate that becomes the matrix substrate 101, there is a tendency that the thickness of the auxiliary conductor 114 becomes smaller than at the time of printing while the thickness becomes larger than the original design dimension of the auxiliary conductor 114.

However, as described above, the auxiliary conductor 114 including the wide conductor 115 and the narrow conductor 116 is provided on the inner surface of the notch 204. The wide conductor 115 is provided in the region connected to the connection conductor 107 in the vicinity of the first notch 205. Both the narrow conductor 116 and the wide conductor 115 of the auxiliary conductor 114 are provided in the region not connected to the connection conductor 107 in the vicinity of the second notch 206. Due to such a structure, even if pressure is applied during lamination, the width of the conductor constituting the wide conductor 115 is large, and the conductive path can be secured by the wide conductor 115 even if the auxiliary conductor 114 is thinned by pressurization. Because the width of the conductor constituting the narrow conductor 116 is small, even if the auxiliary conductor 114 expands to the connection conductor 107 by pressurization, the interval (W2) between the narrow conductor 116 and the connection conductor 107 can be secured.

Figure 6A:
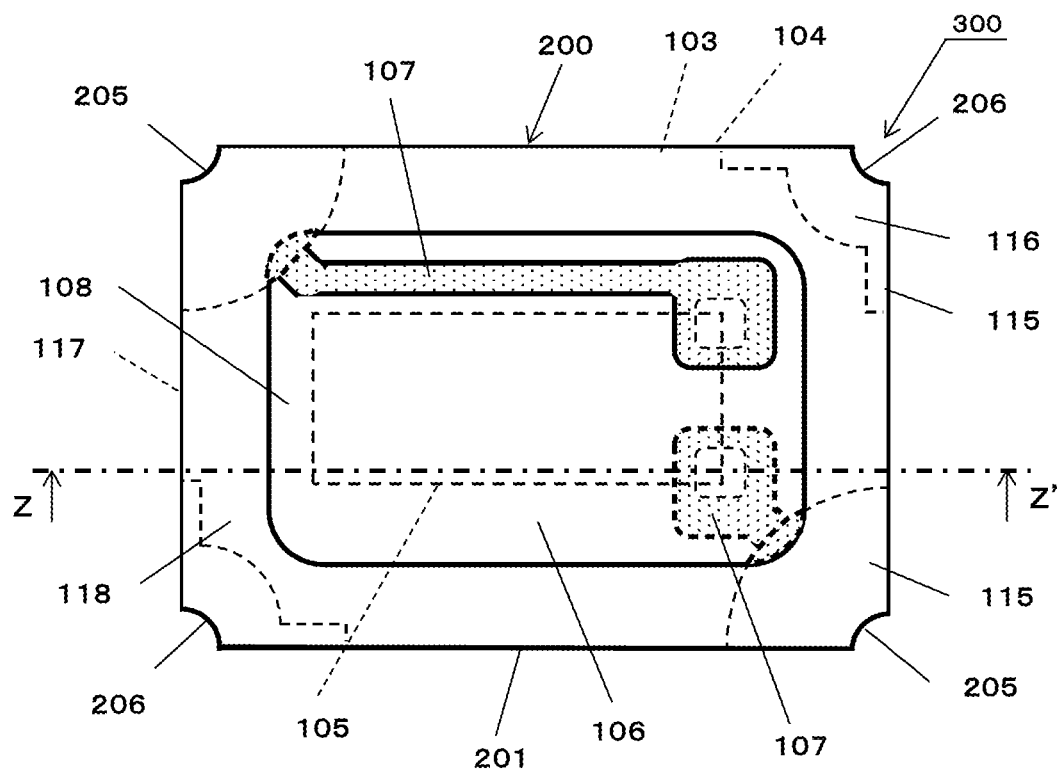
FIG. 6A is a plan perspective view illustrating an electronic component housing package according to the present embodiment.
Figure 6B:
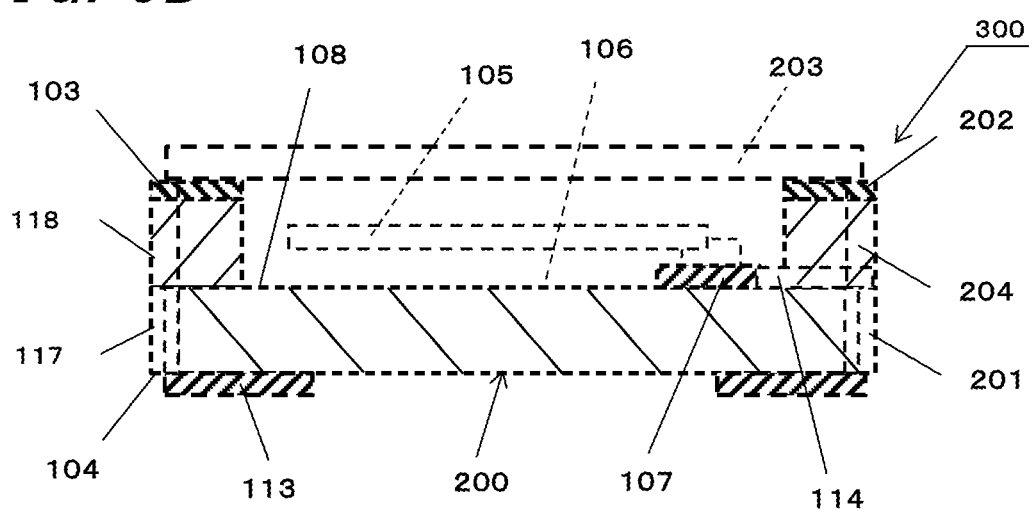
FIG. 6B is a sectional perspective view taken along line Z-Z' in FIG. 6A.

An example of a wiring substrate that becomes such an electronic component housing package 200 is illustrated in a plan perspective view and a cross-sectional perspective view in FIGS. 6A and 6B. In this example, the mount portion 106 provided on the third main surface 108 of the insulating substrate 201 is provided with a pair of connection conductors 107 along the short side. After the electronic component 105 such as a crystal oscillator and a semiconductor element is connected by the bonding material such as conductive adhesive to the pair of connection conductors 107 and accommodated, the lid 203 is bonded with a brazing material or the like to the frame-shaped metallized layer 202 provided on the upper surface (first main surface 103) of the frame portion 118 so as to surround the mount portion 106 in a plan view and the mount portion 106 is hermetically sealed. That is, the brazing material is integrated with the lower surface of the lid 203 in advance, and the lid 203 made of metal is placed on the frame-shaped metallized layer 202, followed by the heat treatment. Thus, the lid 203 is bonded and the mount portion 106 is hermetically sealed.

The electronic component housing package 200 may employ the following method. The lid 203 made of metal is placed on a metal frame body (not illustrated) previously bonded to the upper surface of the insulating substrate 201 by a method such as brazing. While bringing a pair of roller electrodes of a seam welding machine into contact with the outer periphery of the lid 203 and rotating the roller electrodes, a large current for welding is fed between the roller electrodes. A contact portion between the roller electrodes and the lid 203 is heated to a high temperature by this resistance heating, and the lid 203 is seam welded to the metal frame body by this heat to perform hermetic sealing.

The electronic device 300 according to the present embodiment includes the electronic component housing package 200 described above and the electronic component 105 mounted on the electronic component housing package 200. With such a structure, it is possible to provide the electronic device 300 that can suppress a decrease in electrical conductivity and disconnection between the connection conductor 107 and the auxiliary conductor 114, and is good in a deposition property of a metal layer to each wiring conductor by electroplating and connection reliability with the electronic component 105, even if the electronic component housing package 200 is reduced in size. Since the interval (W1) between the wide conductor 115 and the connection conductor 107 can be reduced, a conduction path is secured by the wide conductor 115. Thus, if manufacturing the matrix substrate 101 on which the electronic component housing packages 200 are arranged, a metal layer is satisfactorily deposited by electroplating to the exposed wiring conductor of each electronic component housing package 200. Accordingly, it is possible to provide the electronic device 300 having good electrical connectivity between the electronic component 105 and the connection conductor 107, and between the external connection conductor 113 and a connection pad and the like of a circuit substrate (not illustrated) on which the electronic device 300 is mounted.

The interval (W2) between the narrow conductor 116 and the connection conductor 107 is large, and for example, if the electronic component 105 such as a piezoelectric vibration element is mounted on the connection conductor 107 with the bonding material or the like, the possibility of short-circuiting can be reduced. If the electronic component housing package 200 is used, in which the narrow conductor 116 is not exposed to the mount portion 106 on the third main surface 108 and is covered with the frame portion 118 provided on the third main surface 108, it is possible to provide the electronic device 300 that suppresses short-circuit more effectively and that is good in connection reliability.

The multi-piece wiring substrate (matrix substrate 101), the electronic component housing package 200, and the electronic device 300 of the present disclosure are not limited to the examples of the embodiments described above, and various alterations may be made thereto without departing from the gist of the present disclosure. For example, in the examples of the embodiments described above, although the matrix substrate 101 is composed of two insulating layers in which the wiring substrate regions 102 provided with the concave mount portion 106 are arranged, the matrix substrate 101 may be composed of three or more insulating layers, or may be configured by a matrix substrate 101 on which a flat plate-shaped wiring substrates (not illustrated) having no recess are arranged. Although the shape of the through-holes 112 provided on the outer edge of the wiring substrate regions 102 arranged on the matrix substrate 101 is a circular shape, it may be an elliptical shape, a long hole shape, or other shapes.

The invention claimed is:

1. A multi-piece wiring substrate comprising:
   a matrix substrate comprising
     a first main surface,
     a second main surface opposite to the first main surface,
     a third main surface disposed between the first main surface and the second main surface, the third main surface comprising a mount portion for mounting an electronic component, and a connection conductor for connecting to the electronic component,
     an arrangement of a plurality of wiring substrate regions,
     a margin region surrounding the plurality of wiring substrate regions, and
     a dividing groove on the first main surface and the second main surface along a boundary between the wiring substrate regions and a boundary between the wiring substrate regions and the margin region;
   a through-hole disposed across the boundary between the wiring substrate regions or the boundary between the wiring substrate regions and the margin region, and which penetrates from the first main surface to the second main surface; and
   an external connection conductor at each corner of the wiring substrate regions on the second main surface, wherein
   an auxiliary conductor is disposed around the through-hole on the third main surface, the auxiliary conductor comprises a wide conductor on a side connected to the connection conductor and a narrow conductor on a side not connected to the connection conductor, and the wide conductor is disposed across the boundary of the wiring substrate regions adjacent to each other.

2. The multi-piece wiring substrate according to claim 1, wherein the through-hole is disposed at four corners of the wiring substrate regions.

3. The multi-piece wiring substrate according to claim 1, wherein the wiring substrate regions are rectangular in a plan view, and
the through-hole is disposed on a short side or a long side of the wiring substrate regions.

4. The multi-piece wiring substrate according to claim 1, wherein the wide conductor is exposed to the mount portion on the third main surface.

5. The multi-piece wiring substrate according to claim 1, wherein the narrow conductor is not exposed to the mount portion on the third main surface and is covered with a frame portion on the third main surface.

6. An electronic component housing package comprising:
an insulating substrate comprising
  a first main surface,
  a second main surface opposite to the first main surface, and
  a third main surface disposed between the first main surface and the second main surface, the third main surface comprising a mount portion for mounting an electronic component, and a connection conductor for connecting to the electronic component;
a notch at an outer edge of the insulating substrate from the first main surface to the second main surface, the notch comprising a first notch and a second notch; and
a plurality of external connection conductors at the insulating substrate on the second main surface, wherein
on the third main surface, an auxiliary conductor comprising a wide conductor and a narrow conductor is disposed on an inner surface of the notch, the wide conductor is disposed in a region connected to the connection conductor in a vicinity of the first notch, and both the narrow conductor and the wide conductor of the auxiliary conductor are disposed in a region not connected to the connection conductor in a vicinity of the second notch.

7. An electronic device comprising:
the electronic component housing package according to claim 6; and
an electronic component mounted on the electronic component housing package.

8. The multi-piece wiring substrate according to claim 2, wherein the wide conductor is exposed to the mount portion on the third main surface.

9. The multi-piece wiring substrate according to claim 3, wherein the wide conductor is exposed to the mount portion on the third main surface.

10. The multi-piece wiring substrate according to claim 2, wherein the narrow conductor is not exposed to the mount portion on the third main surface and is covered with a frame portion on the third main surface.

11. The multi-piece wiring substrate according to claim 3, wherein the narrow conductor is not exposed to the mount portion on the third main surface and is covered with a frame portion on the third main surface.

12. The multi-piece wiring substrate according to claim 4, wherein the narrow conductor is not exposed to the mount portion on the third main surface and is covered with a frame portion on the third main surface.

13. The multi-piece wiring substrate according to claim 8, wherein the narrow conductor is not exposed to the mount portion on the third main surface and is covered with a frame portion on the third main surface.

14. The multi-piece wiring substrate according to claim 9, wherein the narrow conductor is not exposed to the mount portion on the third main surface and is covered with a frame portion on the third main surface.

\* \* \* \* \*